United States Patent [19]

Weinl

[11] Patent Number: 5,682,590
[45] Date of Patent: Oct. 28, 1997

[54] COATED TITANIUM-BASED CARBONITRIDE

[75] Inventor: Gerold Weinl, Älvsjö, Sweden

[73] Assignee: Sandvik AB, Sandviken, Sweden

[21] Appl. No.: 589,870

[22] Filed: Jan. 23, 1996

[30] Foreign Application Priority Data

Feb. 8, 1995 [SE] Sweden ................................ 9500472

[51] Int. Cl.$^6$ .................................................. B22F 1/00
[52] U.S. Cl. ...................... 419/15; 419/14; 419/16; 419/46; 419/13; 75/238; 75/244; 427/473
[58] Field of Search .......................... 419/15, 14, 16, 419/46, 13; 75/238, 244; 264/DIG. 36; 420/417

[56] References Cited

U.S. PATENT DOCUMENTS 4,290,807  9/1981  Asia et al. ................................ 75/233
4,409,876  10/1983  Yamamoto et al. .
4,634,600  1/1987  Shimizu et al. ........................ 427/38
5,314,657  5/1994  Ostlund .

FOREIGN PATENT DOCUMENTS 495101  7/1990  European Pat. Off. .

Primary Examiner—Charles T. Jordan
Assistant Examiner—Anthony R. Chi
Attorney, Agent, or Firm—Burns, Doane, Swecker & Mathis, L.L.P.

[57] ABSTRACT

A titanium-based carbonitride grade for finishing and semi-finishing turning operations with excellent properties is obtained starting from a titanium-based carbonitride grade used for milling operations. The carbon content of a conventional titanium-based carbonitride grade used for milling operations is optimized in such a way that it is close to the point where η-phase or other substoichiometric phases are formed. The improved titanium-based carbonitride is also provided with a thin wear resistant Ti-containing coating deposited preferably by PVD technique.

11 Claims, 1 Drawing Sheet

COATED TITANIUM-BASED CARBONITRIDE

BACKGROUND OF THE INVENTION

The present invention relates to coated titanium-based carbonitride turning inserts with excellent properties for finishing and semi-finishing operations.

Cermet grades, i.e., sintered titanium-based carbonitride alloys with titanium as the main component, are now well established materials used for cutting tool applications like milling, turning and drilling. They are preferably used for finishing and semi-finishing operations owing to their extraordinary wear resistance at high cutting temperatures.

The demands on these grades are quite different depending on the operation. Turning operations very often produce high temperatures during cutting together with a highly abrasive wear which leads to flank and crater wear and, in the case of too much wear, to plastic deformation on the cutting edge. Milling operations on the other hand, are by nature interrupted cuttings and grades used in such operations principally need good resistance to mechanical and thermal shocks.

Many efforts have been made during the last few years in developing cermets grades which work very well in their intended applications. There is, however, still a lack of grades which are top performers in both milling and turning operations owing to the apparent impossibility to combine the above-mentioned different demands for the grade. One attempt to overcome the said problem has been coating of existing tough grades, often used in milling applications, with, for instance, TiN and/or TiCN, mainly by a PVD process. This design gives a definitely more wear resistant product. Other properties of the grade, however, remain unaffected and it does not have all the properties needed for turning applications earlier mentioned, for instance, enough resistance to plastic deformation when the temperature is increased. This disadvantage is particularly observed when the coating is worn or flaked.

From U.S. Pat. No. 5,314,657, a titanium-based carbonitride alloy with cutting properties well-balanced mainly for milling and drilling is known. The said alloy is characterized by the formula:

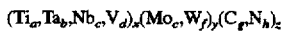

representing the composition of the hard constituent phase where the indices a–f are the molar index of each element of the carbide, carbonitride or nitride formers, and the indices g–h are the molar index of carbon and nitrogen, respectively. The following relations apply:

a+b+c+d=1 e+f=1 g+h=1 x+y=1 and z<1

The same alloy when sintered is characterized by the following relations:

0.88<a<0.96, preferably, 0.90 <a<0.94

0.04<b<0.08, preferably, 0.05 <b<0.07

0≦c<0.04, preferably, 0≦c<0.03

0≦d<0.04, preferably, 0≦d<0.03

0.60<f<0.73, preferably, 0.66<f<0.72

0.80<x<0.90, preferably, 0.82<x<0.88

0.32<h<0.40, preferably, 0.34<h<0.38

Oxygen is present as impurity.

The total amount of binder which is Co+Ni is 12–17%, preferably 14–17%, by weight with 0.6<Co/(Co+Ni)<0.7, preferably Co/(Co+Ni)=⅔.

OBJECTS AND SUMMARY OF THE INVENTION

It is an object of this invention to avoid or alleviate the problems of the prior art.

It is further an object of this invention to provide coated titanium-based carbonitride turning inserts with excellent properties for finishing and semi-finishing operations.

In one aspect of the invention there is provided a coated cutting tool insert for turning applications comprising hard constituents in a binder phase based on cobalt and nickel where the composition of the hard constituent phase is represented by the formula: $(Ti_a,Ta_b,Nb_c,V_d)_x(Mo_e,W_f)_y(C_g,N_h)_z$ where 0.88<a<0.96

0.04<b<0.08

0≦c<0.04

0≦d<0.04

0.60<f<0.72

0.80<x<0.90

0.31<h<0.40 and with a binder phase content of 12–17% by weight with 0.6<Co/(Co+Ni)<0.7 wherein said insert has a total carbon content at about the limit of formation of η-phase and a 2–8μm coating comprising at least one PVD layer of carbide, nitride or carbonitride of Ti.

In another aspect of the invention there is provided a method of manufacturing a titanium-based carbonitride alloy comprising hard constituents in a binder phase based on cobalt and nickel where the composition of the hard constituent phase is represented by the formula: $(Ti_a,Ta_b,Nb_c,V_d)_x(Mo_e,W_f)_y(C_g,N_h)_z$ by the powder metallurgical methods of milling a mixture of powders forming binder phase and powders forming the hard constituents, pressing and sintering said mixture wherein:

0.88<a<0.96

0.04<b<0.08

0≦c<0.04

0≦d<0.04

0.60<f<0.72

0.80<x<0.90 and 0.31<h<0.40 with a binder phase content of 12–17% by weight with 0.6<Co/(Co+Ni)<0.7 comprising adjusting the carbon content of said powder mixture, taking into account its oxygen content, prior to sintering such that the total carbon content of the sintered alloy is as close as possible to the point where η-phase or other substoichiometric phases are formed and depositing a 2–8 μm coating comprising at least one PVD layer of carbide, nitride or carbonitride of Ti.

In yet another aspect of the invention there is provided a coated cutting tool insert of a titanium-based carbonitride alloy, the improvement comprising using an alloy having a carbon content at about the amount where a substoichiometric η-phase forms and a coating on said insert of from 2–8 μm of at least one PVD layer of a carbide, nitride or carbonitride of Ti.

BRIEF DESCRIPTION OF THE DRAWING

The FIGURE shows the microstructure at 4000x of a coated insert according to the presently claimed invention.

DETAILED DESCRIPTION OF THE PREFERRED EMBODIMENTS OF THE INVENTION

Figure 1:
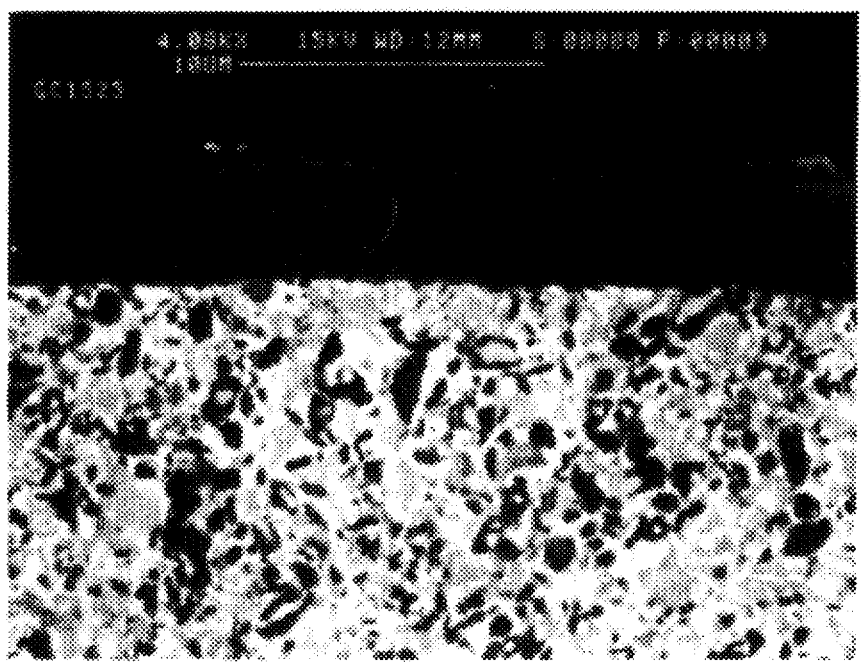

It has now surprisingly been found that it is possible to obtain an excellent turning grade for finishing and semi-finishing operations from the alloy according to the U.S. Pat. No. 5,314,657 by optimizing its carbon content and providing it with a thin coating deposited preferably by PVD technique.

A titanium-based carbonitride alloy according to the presently claimed invention has a composition similar to that of U.S. Pat. 5,314,657, but with the carbon content of the starting powder mixture chosen such that the carbon content in the final structure is in excess of that theoretically necessary and at about the limit of the formation of η-phase, ($M_6C$ or $M_{12}C$, e.g., $W_3Co_3C$ or other substoichiometric phase). Preferably, the structure shall be free of η-phase. However, a small amount, <0.02 volume %, of evenly distributed fine-grained η-phase can be accepted.

Cutting inserts according to the presently claimed invention are made from said alloy and are coated using PVD methods, preferably ion plating, with a 2–8 μm coating comprising at least one PVD layer of carbide, nitride or carbonitride of Ti. Particularly good results have been obtained for a first (innermost) TiCN layer with a thickness of 5+3 μm and a second, <1 μm, TiN layer. Due to the method chosen, the coating thickness often varies between the different faces of the insert. Other coating techniques may also be used provided that the negative influence of Ni in the binder phase is minimized or eliminated.

Titanium-based carbonitride inserts according to the presently claimed invention are manufactured by conventional powder metallurgical methods. Powders forming binder phase and powders forming the hard constituents are mixed to a mixture with desired composition. From the mixture, inserts are pressed and sintered in vacuum at a pressure of <10 mbar at 1400°–1600° C. The cooling to room temperature takes place in vacuum or in inert gas. After surface treatment, the inserts are coated as above described.

The carbon content of said powder mixture has to be chosen depending on its oxygen content, milling time and sintering conditions such that the total carbon content of the sintered alloy is as close as possible to the point where η-phase or other substoichiometric phases are formed. Such phases are, of course, well-known in these types of alloys and the carbon content at which η-phase forms can be determined for any particular alloy using conventional techniques known to the skilled artisan. Preferably, said carbon content shall be 0.25–0.35%, most preferably about 0.3%, by weight above the theoretical stoichiometric composition. This level of carbon content generally results in a structure on the limit of η-phase formation. This carbon content once found for a certain composition and manufacturing conditions is easy to control and measure by, for instance, the magnetic cobalt content in the sintered alloy. It can also be found by, e.g., a light decarburizing treatment upon which η-phase is rapidly formed.

In a preferred embodiment, a titanium-containing powder is used in which the grains are rounded, non-angular with a logarithmic normal distribution standard deviation of <0.23 logarithmic μm most preferably produced by directly carburizing or carbonitriding the oxides of the metals or of the metals themselves.

Inserts according to the presently claimed invention have shown particularly good results in semi-finishing operations of non-alloyed carbon steel, low-alloyed steel and finishing operations of stainless steels and nodular cast iron. They can also be used in light intermittent machining operations.

The invention is additionally illustrated in connection with the following Examples which are to be considered as illustrative of the present invention. It should be understood, however, that the invention is not limited to the specific details of the Examples.

EXAMPLE 1

Turning inserts TNMG 160408MF according to the presently claimed invention, were made by mixing in weight %, 26.4 (Ti,Ta)(C,N), 11.6 (Ti,Ta)C, 20 Ti(C,N), 1.4 TiN, 1.8 NbC, 17.7WC, 4.6 $Mo_2C$, 11Co, 5.5 Ni and 0.3 soot, pressing and vacuum sintering at 1430° C. The Ti-containing powders used had grains which were rounded, non-angular with a logarithmic normal distribution with a standard deviation of <0.23 logarithmic μm.

The composition of the hard constituent of the sintered inserts was according to the formula $(Ti_a,Ta_b,Nb_c,V_d)_x(Mo_e,W_f)_y(C_g,N_h)_z$ in which a=0.906, b=0.056, c=0.038, d=0.0, e=0.333, f=0.667, g=0.616, h=0.384, x=0.862 and y=0.318. The structure was free of η-phase. However, the cobalt magnetic content of the sintered inserts showed a value of 4.3% which indicates that the alloy was close to η-phase formation.

EXAMPLE 2

TNMG160408MF inserts of the alloy from Example 1 were coated with an about 4 μm thick TiCN- +<1 μm TiN-layer using ion plating technique (Sample C). At the same time inserts from a commercially available cermet grade according to U.S. Pat. No. 5,314,657 were coated (Sample B). The inserts B and C were tested together with inserts of said commercially available uncoated prior an alloy (Sample A), and of the best competitor coated carbonitride alloy (Sample D), in a longitudinal turning wear resistance test with the following cutting data:

Work piece material: Ovako 825B

Speed: 250 m/rain

Feed: 0.2 mm/rev

Depth of cut: 1.0 mm

Coolant: yes

Tool life criterion: edge fracture or poor surface on the work piece material

Three edges of each alloy were tested. The result expressed in terms of relative figures with Sample A being valued as 1.0 is shown in the table below:

| Alloy Sample | Magnetic Cobalt Content, Wt-% | Coated | Resistance to Flank Wear | Resistance to Crater Wear | Relative Tool Life |
|---|---|---|---|---|---|
| A Prior Art | 6.5 | No | 1.0 ± 0.1 | 1.0 ± 0.2 | 1.0 ± 0.1 |
| B Prior Art | 6.5 | Yes | 1.2 ± 0.1 | 1.9 ± 0.1 | 1.6 ± 0.2 |
| C According to the Invention | 4.3 | Yes | 1.5 ± 0.05 | 2.3 ± 0.1 | 2.3 ± 0.02 |
| D Prior Art | — | Yes | 1.2 ± 0.01 | 1.6 ± 0.1 | 1.5 ± 0.2 |

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. A coated cutting tool insert for turning applications comprising hard constituents in a binder phase based on cobalt and nickel where the composition of the hard constituent phase is represented by the formula: $(Ti_a,Ta_b,Nb_c,V_d)_x(Mo_e,W_f)_y(C_g,N_h)_z$ where $0.88<a<0.96$ $0.04<b<0.08$ $0 \leq c<0.04$ $0 \leq d<0.04$ $0.60<f<0.72$ $0.80<x<0.90$ $0.31<h<0.40$ and with a binder phase content of 12–17% by weight with $0.6<Co/(Co+Ni)<0.7$ wherein said insert has a total carbon content at about the limit of formation of η-phase and a 2–8μm coating comprising at least one PVD layer of carbide, nitride or carbonitride of Ti.

2. The coated insert of claim 1 wherein $0.90<a<0.94$ $0.05<b<0.07$ $0 \leq c<0.03$ $0 \leq d<0.03$ $0.63<f<0.70$ $0.82<x<0.88$ $0.34<h<0.38$.

3. The coated insert of claim 1 wherein said coating comprises an innermost TiCN layer and an outermost, <1μm, TiN layer.

4. The method of manufacturing a titanium-based carbonitride alloy comprising hard constituents in a binder phase based on cobalt and nickel where the composition of the hard constituent phase is represented by the formula: $(Ti_a,Ta_b,Nb_c,V_d)_x(Mo_e,W_f)_y(C_g,N_h)_z$ by the powder metallurgical methods of milling a mixture of powders forming binder phase and powders forming the hard constituents, pressing and sintering said mixture wherein:

$0.88<a<0.96$ $0.04<b<0.08$ $0 \leq c<0.04$ $0 \leq d<0.04$ $0.60<f<0.72$ $0.80<x<0.90$ and $0.31<h<0.40$ with a binder phase content of 12–17% by weight with $0.6<Co/(Co+Ni)<0.7$ comprising adjusting the carbon content of said powder mixture, taking into account its oxygen content, prior to sintering such that the total carbon content of the sintered alloy is as close as possible to the point where η-phase or other substoichiometric phases are formed and depositing a 2–8μm coating comprising at least one PVD layer of carbide, nitride or carbonitride of Ti.

5. The method of claim 4 wherein $0.90<a<0.94$ $0.05<b<0.07$ $0 \leq c<0.03$ $0 \leq d<0.03$ $0.63<f<0.70$ $0.82<x<0.88$ $0.34<h<0.38$.

6. The method of claim 4 wherein depositing said 2–8 μm coating comprises depositing a first coating comprising an innermost TiCN layer and then depositing an outermost, <1 μm, TiN layer.

7. The method of claim 4 wherein the powder comprises at least one Ti-containing powder the grains of which are rounded, non- angular with a logarithmic normal distribution standard deviation of <0.23 logarithmic μm.

8. The method of claim 4 wherein said carbon content is from 0.25 to 0.35 % by weight greater than the theoretical stoichiometric carbon content of the powder mixture.

9. The method of claim 8 wherein said carbon content is about 0.3% by weight greater than the theoretical stoichiometric carbon content of the powder mixture.

10. The method of claim 7 wherein the at least one Ti-containing powder is produced by carburizing or carbonitriding either the metals of the powder or their oxides.

11. In a coated cutting tool insert of a titanium-based carbonitride alloy, the improvement comprising using an alloy having a carbon content at about the amount where a substoichiometric η-phase forms and a coating on said insert of from 2–8μm of at least one PVD layer of a carbide, nitride or carbonitride of Ti.

* * * * *